(12) United States Patent
McRay

(10) Patent No.: US 9,190,312 B2
(45) Date of Patent: Nov. 17, 2015

(54) EXTREMELY LOW TEMPERATURE ROTARY UNION

(75) Inventor: Richard F. McRay, Penn Valley, CA (US)

(73) Assignee: ADVANCED ION BEAM TECHNOLOGY, INC., Hsin-Chu (TW)

(*) Notice: Subject to any disclaimer, the term of this patent is extended or adjusted under 35 U.S.C. 154(b) by 919 days.

(21) Appl. No.: 13/192,356

(22) Filed: Jul. 27, 2011

(65) Prior Publication Data

US 2013/0026722 A1    Jan. 31, 2013

(51) Int. Cl.
  *B23B 31/02*    (2006.01)
  *H01L 21/687*   (2006.01)

(52) U.S. Cl.
  CPC ..... *H01L 21/68792* (2013.01); *Y10T 279/3493* (2015.01)

(58) Field of Classification Search
  CPC ................................ H01L 21/68792
  USPC .......... 279/157, 128; 277/358, 367, 369, 370, 277/371, 377; 464/7, 182
  See application file for complete search history.

(56) References Cited

U.S. PATENT DOCUMENTS

| | | | | |
|---|---|---|---|---|
| 2,859,054 A | * | 11/1958 | Willi | 277/364 |
| 5,738,574 A | * | 4/1998 | Tolles et al. | 451/288 |
| 6,033,478 A | * | 3/2000 | Kholodenko | 118/500 |
| 6,080,272 A | * | 6/2000 | Langley et al. | 156/345.53 |
| 6,447,379 B1 | * | 9/2002 | Gromko et al. | 451/287 |
| 6,689,221 B2 | | 2/2004 | Ryding et al. | |
| 6,916,022 B2 | | 7/2005 | Auber | |
| 7,381,274 B2 | | 6/2008 | Lee | |
| 7,528,392 B2 | | 5/2009 | England et al. | |
| 7,726,658 B2 | | 6/2010 | Grunwald et al. | |
| 7,798,496 B2 | | 9/2010 | Dietle et al. | |
| 7,815,194 B2 | * | 10/2010 | Suzuki | 277/372 |
| 2005/0093246 A1 | | 5/2005 | Dietle et al. | |

* cited by examiner

*Primary Examiner* — Eric A Gates
*Assistant Examiner* — Chwen-Wei Su
(74) *Attorney, Agent, or Firm* — Morrison & Foerster LLP

(57) ABSTRACT

A chuck assembly has a wafer chuck attached to a shaft that has a passage defined therewithin. The chuck assembly also has a seal module that has a rotatable assembly and a fixed assembly. The rotatable assembly is disposed around and anchored to the shaft and has a spacer, a rotatable collar, a rotatable diaphragm, and a rotatable seal ring connected to the rotatable collar through the diaphragm with a leak-tight seal. The fixed assembly is disposed around the spacer and has a fixed collar and a fixed seal ring that is sealed to the fixed collar with a leak-tight seal. The fixed collar has a passage defined therewithin that has an opening that connects through the spacer to the passage defined within the shaft. The chuck assembly further includes a housing, to which the fixed assembly is fastened, that may be affixed to a base.

19 Claims, 5 Drawing Sheets

EXTREMELY LOW TEMPERATURE ROTARY UNION

BACKGROUND

1. Field

This application generally relates to a low temperature rotary union, and, more specifically, to an extremely low temperature rotary union implemented in a seal module, which is used to supply coolant to a rotating wafer chuck.

2. Description of the Related Art

The push for smaller transistors has led to the need for shallower and higher quality semiconductor junctions. For example, modern complementary metal oxide semiconductor (CMOS) transistors require very shallow and abrupt source and drain junctions.

One approach to forming a shallower and higher quality junction involves amorphization of the semiconductor surface on one side of the junction. In particular, during ion implantation of the junction, one side of the junction is amorphized. The amorphization of the semiconductor surface can be increased by performing ion implantation with the semiconductor substrate at a lower temperature.

In one conventional approach, the wafer is cooled prior to performing ion implantation. One problem with this approach is that the temperature of the wafer, and thus the semiconductor substrate, will increase during ion implantation.

SUMMARY

In one exemplary embodiment, a chuck assembly has a wafer chuck attached to a shaft that has a passage defined therewithin. The chuck assembly also has a seal module that has a rotatable assembly and a fixed assembly. The rotatable assembly is disposed around the shaft and has a spacer, a rotatable collar, a rotatable diaphragm, and a rotatable seal ring connected to the rotatable collar through the diaphragm with a leak-tight seal. The rotatable assembly is anchored to the shaft by an axial clamp. The fixed assembly is disposed around the spacer and has a fixed collar and a fixed seal ring that is sealed to the fixed collar with a leak-tight seal. The fixed collar has a passage defined therewithin that has an opening that connects through the spacer to the passage defined within the shaft. The chuck assembly further includes a housing that may be affixed to a base. The fixed assembly is fastened to the housing. The wafer chuck, the shaft, and the rotatable assembly may rotate with respect to the housing and the fixed assembly while a seal is maintained between the fixed and rotatable seal rings.

Some embodiments of a chuck assembly may use only metals, ceramics, metal ceramics, or a combination of one or more of these materials. Other embodiments may also use other cold-resistant materials.

DESCRIPTION OF THE FIGURES

The present application can be best understood by reference to the following description taken in conjunction with the accompanying figures, in which like parts may be referred to by like numerals.

The figures depict various embodiment of the present invention for purposes of illustration only. One skilled in the art will readily recognize from the following discussion that alternative embodiments of the structures and methods illustrated herein can be employed without departing from the principles of the invention described herein.

DETAILED DESCRIPTION

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

As mentioned above, the amorphization of the semiconductor surface of a semiconductor junction can be increased by performing ion implantation with the semiconductor substrate at a lower temperature. As also mentioned above, a conventional approach of cooling the wafer prior to performing ion implantation has the problem that the temperature of the semiconductor substrate increases during ion implantation.

Figure 1:
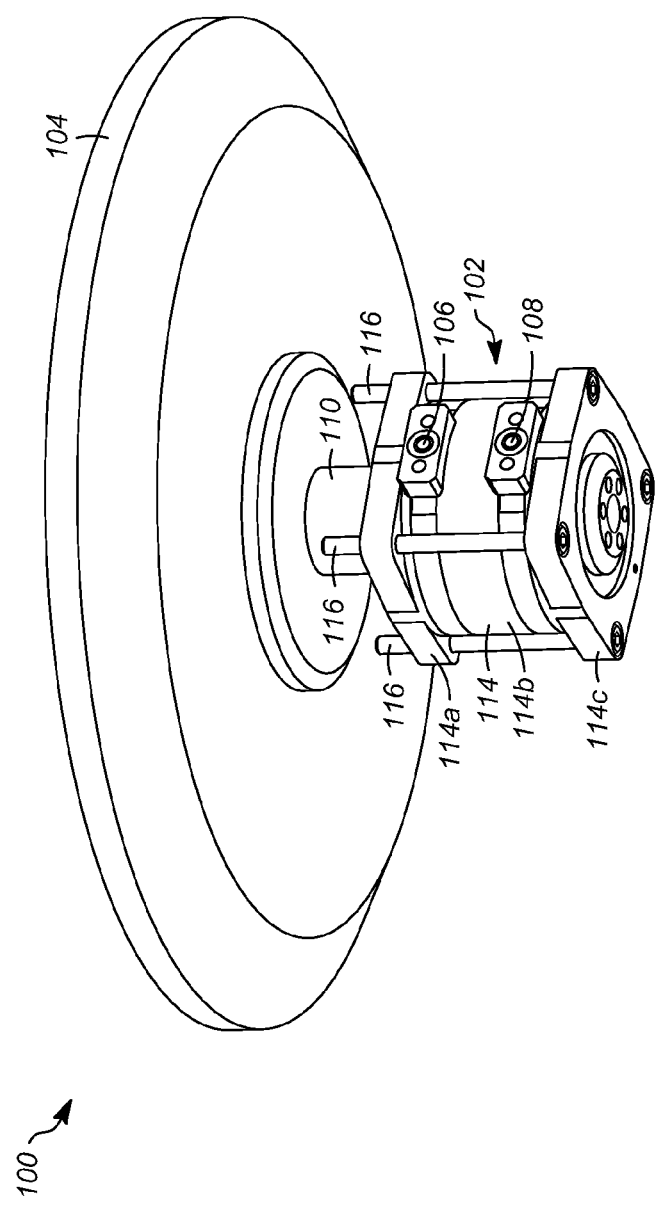
FIG. 1 depicts a chuck assembly using an exemplary seal module.

Thus, with reference to FIG. 1, in one exemplary embodiment, wafer chuck assembly 100 is configured to maintain the wafer, and thus the semiconductor substrate, at a desired low temperature during ion implantation. The wafer chuck assembly may operate to maintain the wafer at temperatures as low as −20° C. to −120° C.

In particular, wafer chuck assembly 100 includes wafer chuck 104 and a seal module 102, which is configured to deliver coolant to wafer chuck 104, while wafer chuck 104 is rotated. Although the present exemplary embodiment is described with seal module 102 being used to deliver coolant to wafer chuck 104, it should be recognized that seal module 102 can be used to deliver any desired liquid or gas to wafer chuck 104.

Conventional seal modules use polymers, such as polytetrafluoroethylene, to create seals that are maintained while a portion of an assembly rotates with respect to another portion of the assembly. However, in the application of low temperature implantation, use of such polymers for seals is not available because low temperatures cause polymers to become brittle and breakdown. Accordingly, in the present exemplary embodiment, the seal module uses metal or metal ceramic construction. Therefore, the seal module of the present embodiment is appropriate for low temperature application because the metal components do not become brittle or breakdown at low temperatures. Other embodiments may use other materials, especially embodiments that are not designed for low temperature use.

Wafer chuck 104 is configured to hold the wafer in place and may be an electrostatic chuck that holds the wafer in place through electrostatic forces. As depicted in FIG. 1, wafer chuck 104 is connected to shaft 110. Thus, as shaft 110 is rotated, wafer chuck 104 rotates to rotate the wafer.

Figure 2A:
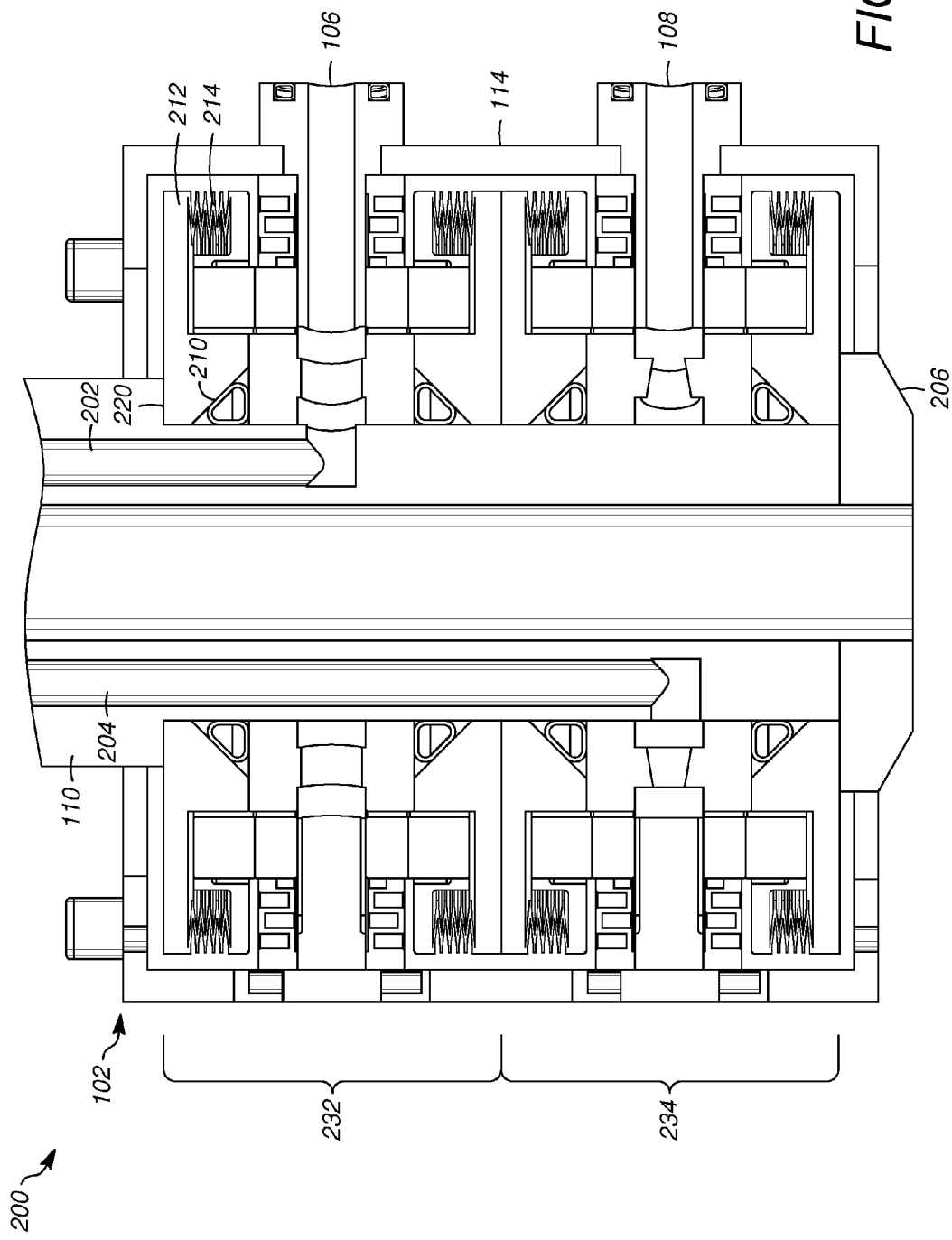
FIG. 2A depicts a cross-section view of the exemplary seal module.

As depicted in FIG. 2A, seal module 102 includes inlet unit 232 and outlet unit 234 having inlet 106 and outlet 108, respectively. Inlet unit 232 and outlet unit 234 are modular, meaning that they are structurally identical or nearly identical. Thus, in certain applications, they can be used interchangeably. For example, inlet unit 232 can be used as an outlet, while outlet unit 234 can be used as an inlet. Alternatively, they can both be used as inlets or outlets. Furthermore, the modularity of the inlet unit 232 and outlet unit 234 allows for any number of inlets or outlets. For example, if a supply gas is desired to assist in heat transfer, an additional inlet unit 232 can be added to seal module 102.

As depicted in FIG. 2A, internal passage 202 is defined along the axial length of shaft 110 to carry coolant from inlet 106 to the wafer chuck. Internal passage 204 is similarly defined along the axial length of shaft 110 to return coolant from the wafer chuck to outlet port 108. It should be recognized that passages 202 and 204 can be defined within the interior of shaft 110, such as by drilling passages 202 and 204 along the axial length of shaft 110. Alternatively, passages 202 and 204 can be piping or flexible tubing (e.g., corrugated flexible metal tubing) disposed within shaft 110, such as within a hollow center, or along channels formed along the exterior of shaft 110.

Figure 2B:
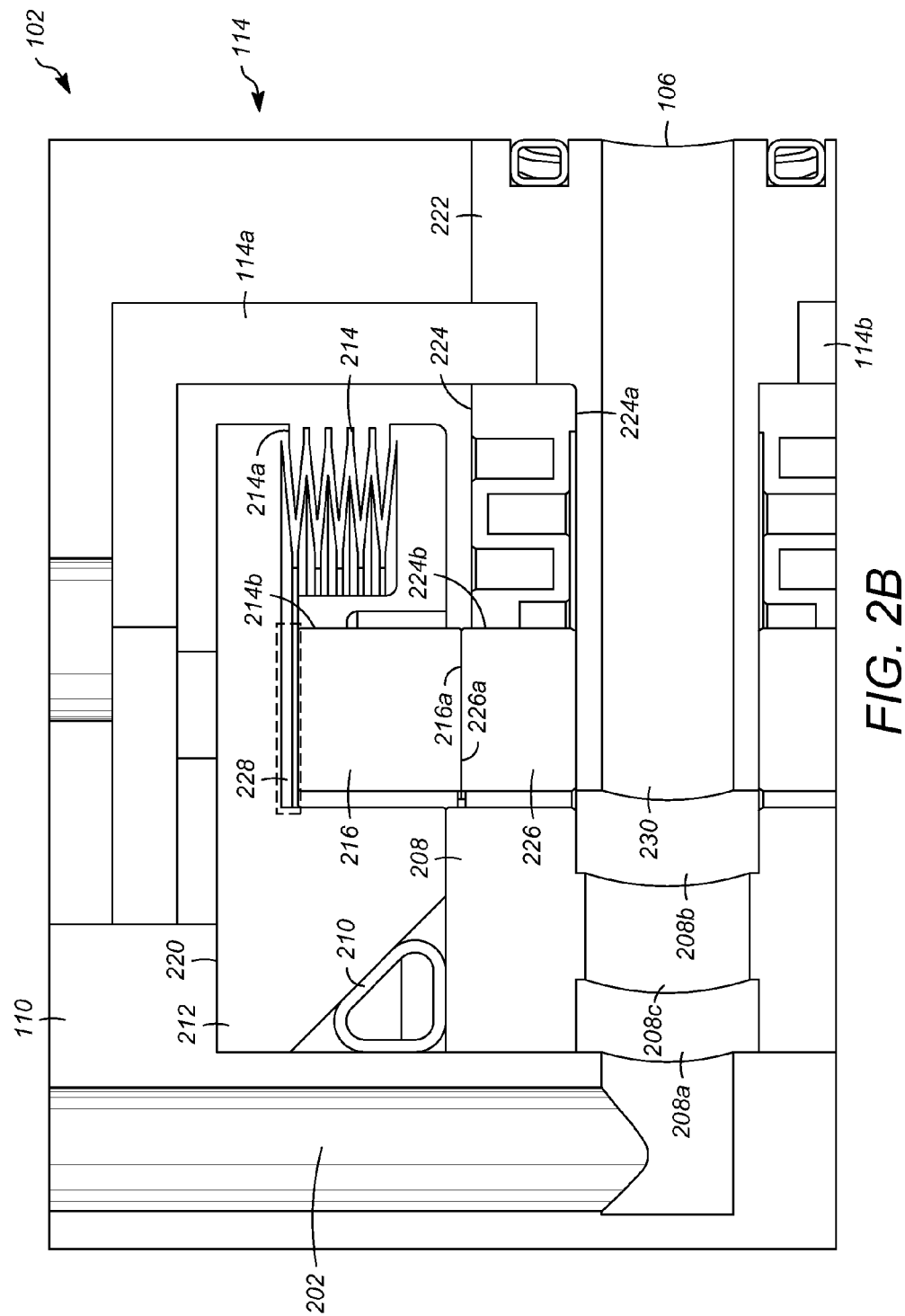
FIG. 2B depicts an enlarged portion of the cross-section view of the exemplary seal module.

With reference to FIG. 2B, coolant is delivered from inlet port 106 to passage 202 through collar 222 and manifold spacer 208. In particular, collar 222 includes internal passage 230. Manifold spacer 208 includes inner channel 208a, openings 208c, and outer channel 208b. Thus, coolant is delivered from inlet port 106 to passage 202 through internal passage 230, outer channel 208b, openings 208c, and inner channel 208a.

As mentioned above, inlet unit 232 and outlet unit 234 are modular. Thus, coolant is returned from passage 204 to outlet port 108 (see FIG. 2A) in a similar manner to how coolant is delivered from inlet port 106 to passage 202.

Figure 4:
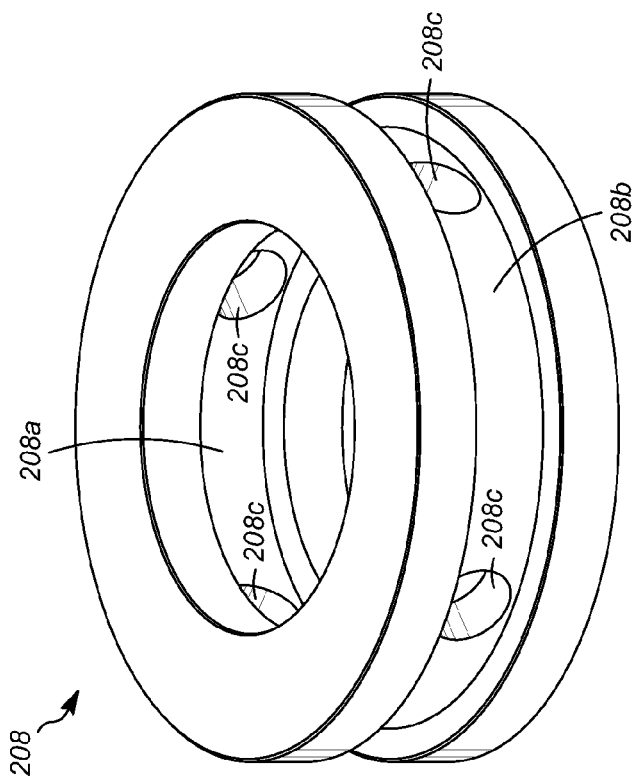
FIG. 4 depicts a spacer manifold.

In the present exemplary embodiment, manifold spacer 208 (depicted individually in FIG. 4) is configured to ensure a path for coolant from inlet passage 230 to reach passage 202 regardless of the orientation of manifold spacer 208 or the orientation of shaft 110 with respect to collar 222. In particular, as depicted in FIG. 4, outer channel 208b is formed around the outer radius of manifold spacer 208. Similarly, inner channel 208a is formed around the inner radius of manifold spacer 208. Openings 208c connect outer channel 208b and inner channel 208a. Thus, because inlet passage 230 opens into outer channel 208b (see FIG. 2B) and passage 202 opens into inner channel 208a (see FIG. 2B), coolant can pass from inlet passage 230 into passage 202 without having openings 208c coaxially aligned with inlet passage 230 or the opening of passage 202.

In the present exemplary embodiment, manifold spacer 208 includes four openings 208c (see FIG. 4). It should be recognized, however, that manifold spacer 208 can have any number of openings 208c. Also, openings 208c can be of various sizes. Furthermore, although manifold spacer 208 has been depicted and described as having two channels, manifold spacer 208 can have any number of channels. For example, a single outer channel with an opening from the outer channel to the inner radius that is always aligned with to passage 202. As another example, manifold spacer 208 can have a single opening with no channels. Instead, the inner and outer channels may be formed on shaft 110 and collar 222, respectively.

Figure 3:
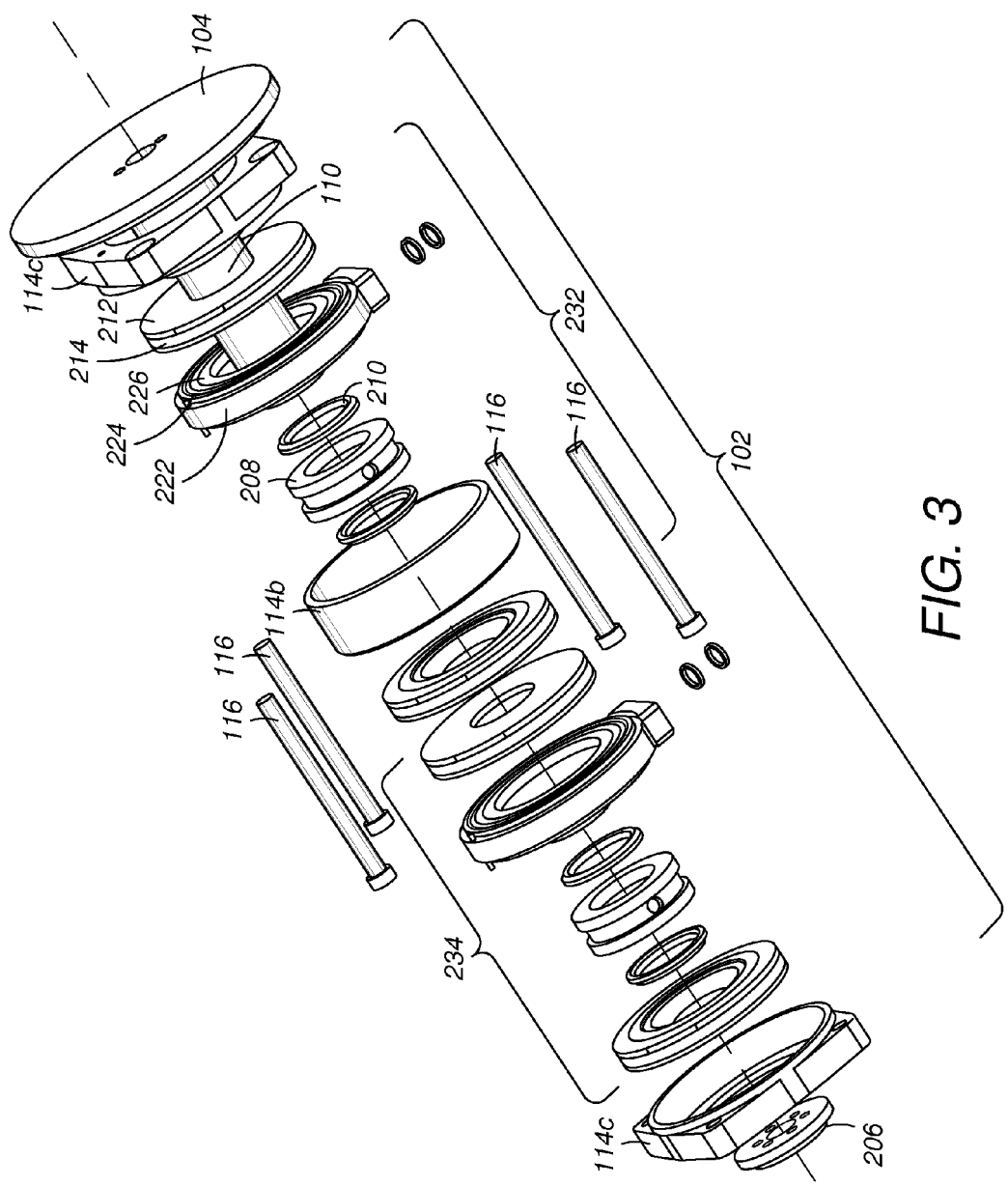
FIG. 3 depicts an exploded view of the exemplary seal module.

With reference to FIG. 3, inlet unit 232 and outlet unit 234 include rotatable components, which rotate with wafer chuck 104 and shaft 110, and stationary components, which remain stationary when wafer chuck 104 and shaft 110 rotate. As discussed above, because of the low temperature operation of the current exemplary embodiment, the rotatable and stationary components are made with metal, ceramics, metal ceramics, or other cold resistant materials.

Figure 5:
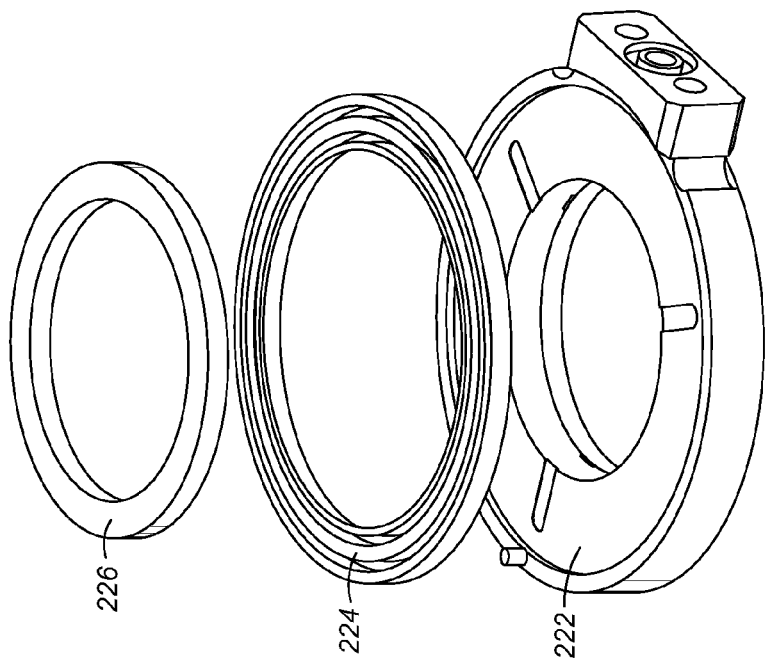
FIG. 5 depicts an exploded view of a collar assembly.

The rotatable components include manifold spacer 208, o-ring 210, and a rotatable collar assembly that includes collar 212, diaphragm 214, and seal ring 216. The stationary components include housing 114 (having top cap 114a, spacer 114b, and bottom cap 114c) and a stationary collar assembly (depicted in FIG. 5) that includes collar 222, expansion diaphragm 224, and seal ring 226. Note that while only the components of inlet unit 232 have been labeled in FIG. 3, outlet unit 234 has the same components as inlet unit 232.

With reference again to FIG. 2A, the rotatable components of the rotatable assembly rotate with shaft 110 with respect to housing 114 because the rotatable components are anchored to shaft 110 by axial clamp 206 and shoulder 220 of shaft 110. O-ring 210 may be formed into the depicted triangular shape when o-ring 210 is compressed into the triangular cavity by tightening axial clamp 206. Also, the compression of o-ring 210, which is metal in the present exemplary embodiment, caused by axial clamp 206 creates a leak-tight seal between collar 212 and shaft 110. With reference to FIG. 2B, side 214a of diaphragm 214 is also sealed to collar 212 with a leak-tight seal. Similarly, side 214b is sealed to seal ring 216 with a leak-tight seal. Thus, the connection of shaft 110 to seal ring 216 through o-ring 210, collar 212, and diaphragm 214 is leak-tight.

It should be noted that a "leak-tight seal" does not necessarily mean a perfect seal or that there is absolutely no leakage under all operating conditions. Instead, it refers to acceptable leak performance of the seal for the coolant, pressures, and temperatures that the seal will be exposed to during operation of seal module 102. As will be discussed in more detail below, some of the leak-tight seals mentioned above can be created by welding/brazing joints or a metal o-ring compressed against another surface. Alternatively, if two components that are to be sealed with a leak-tight seal are parts of one continuous piece of material, then the components may still be considered to be connected with leak-tight seals.

With reference again to FIG. 3, the stationary components fit around shaft 110 with enough space that manifold spacer 208 may fit between shaft 110 and the stationary components. With reference to FIG. 2B, the stationary components are fastened to housing 114 by pressure exerted between housing portions 114a, 114b, and 114c by bolts 116 (FIGS. 1 and 3). Collar 222 is sealed to side 224a of expansion diaphragm 224 with a leak-tight seal. Seal ring 226 is sealed to side 224b of expansion diaphragm 224 with a leak-tight seal. Thus, the connection of collar 222 to seal ring 226 through expansion diaphragm 224 is leak-tight.

With continued reference to FIG. 2B, housing 114a need not be sealed to collar 222, but they may be fastened to each other so that collar 222 is immobile with respect to housing 114a. Seal ring 226 need not be directly sealed to collar 222. Instead, as described above, seal ring 226 may be sealed to collar 222 through expansion diaphragm 224, which is sealed to both collar 222 and seal 226 with leak-tight seals. However, expansion diaphragm 224 may be omitted. When expansion diaphragm 224 is omitted, seal ring 226 may be directly sealed to collar 222 with a leak-tight seal. Alternatively, seal ring 226 may be sealed to collar 222 with a leak-tight seal through some other component.

In the present exemplary embodiment, the interface between surfaces 216a and 226a of seal rings 216 and 226, respectively, is the only interface that is a mobile seal, meaning that a seal is maintained while the surfaces move with respect to each other. In other words, when shaft 110 is rotating with respect to housing 114, surface 216a rotates with respect to surface 226a and the seal between the surfaces is maintained as in a conventional face seal.

Additionally, in the present exemplary embodiment, the interface between surfaces 216a and 226a is a leak-tight seal, which is maintained while shaft 110 is rotating with respect to the housing. Furthermore, the leak-tight seal is maintained, while seal module 102 operates at low temperatures.

Thus, in the present exemplary embodiment, seal rings 216 and 226 are formed of a cold-resistant material, such as ceramics or metal. Additionally, surfaces 216a and 226a are formed through a process that produces a suitably smooth and consistent surface to provide a leak-tight seal while the seal rings rotate against each other. For example, surfaces 216a and 226a may be lapped or polished surfaces.

Surfaces 216a and 226a must press against each other under a desired amount of force to maintain a leak-tight seal while still allowing for the surfaces to rotate against each other. In the present exemplary embodiment, diaphragm 214 is configured to apply the desired amount of force to the interface between surfaces 216a and 226a. The amount of force required may vary depend on factors such the materials of the seal rings, the manufacturing tolerances of the various components, or the speed at which wafer chuck 104 is to rotate.

In addition to applying the desired amount of force between the seal rings, diaphragm 214 may also be configured to compensate for variation in the sizing of the rotatable and stationary components. For example, variations in the thicknesses of the components may vary the actual amount of force applied between surfaces 216a and 226a. Diaphragm 214 may be configured to compensate for these variations so that the desired amount of force is applied to surfaces 216a and 226a to maintain a leak-tight seal while the surfaces are rotating against each other.

While diaphragm 214 is depicted as having a bellows-like structure, it should be recognized that diaphragm 214 may have a different structure that still has spring characteristics.

Another mechanism to assist in maintaining the leak-tight seal between surfaces 216a and 226a is space 228 (indicated by a dashed box) between seal ring 216 and collar 212. As coolant is delivered through inlet 106, the pressure in space 228 increases, which increases the force being exerted by seal ring 216 on seal ring 226, which in turn increases the force applied between surfaces 216a and 226a. Therefore, space 228 creates a compensation mechanism that helps to maintain the leak-tight seal between surfaces 216a and 226a. Space 228, however, can be omitted.

Still another mechanism to assist in maintaining the leak-tight seal between surfaces 216a and 226a is expansion diaphragm 224. In particular, if seal module 102 is being used to deliver coolant that is significantly cooler than the temperature of the operating environment, then thermal expansion may be an issue. For example, when the temperature of the coolant changes, the coolant starts initially being delivered, or the coolant stops being deliver, the components of the seal module may expand and contract at different rates. Under these conditions, seal rings 216 and 226 may need to expand and contract together. By having seal ring 216 connected to diaphragm 214 and seal ring 226 connected to expansion diaphragm 224, the seal rings (and components connected to the seal rings) may be able to expand and contract while maintaining a strong seal between surfaces 216a and 226a. As mentioned above, however, expansion diagraph 224 can be omitted.

Although only certain exemplary embodiments have been described in detail above, those skilled in the art will readily appreciate that many modifications are possible in the exemplary embodiments without materially departing from the novel teachings and advantages provided herein. For example, components of seal module 102 that have been described as being separate components may be single components made from a single contiguous piece of material. As a more specific example, collar 212, diaphragm 214, and seal ring 216 may all be a single unit made of a contiguous piece of material. Similarly, seal ring 226 and collar 222 may be a single unit. Accordingly, the general principles defined herein may be applied to other examples and applications without departing from the spirit and scope of the various embodiments.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching.

I claim:

1. A chuck assembly for rotating a wafer while cooling the wafer during an ion implanting process, the chuck assembly comprising:
    a wafer chuck;
    a shaft having an end connected to the wafer chuck, wherein the shaft has a first passage defined along an axial length of the shaft with one end opening into the wafer chuck, and wherein the shaft has a first opening into the first passage, wherein the first opening is disposed at a first location along the axial length of the shaft;
    a seal module comprising:
        a first spacer having a hole defined therewithin that connects a first side of the first spacer that faces the shaft to a second side of the first spacer that is opposite the first side;
        a first rotatable assembly disposed around the shaft, the first rotatable assembly comprising:
            a first rotatable collar having a side in contact with the shaft;
            a first rotatable diaphragm connected to the first rotatable collar with a leak-tight seal; and
            a first rotatable seal ring connected to the first rotatable diaphragm with a leak-tight seal; and
        a first fixed assembly disposed around the first spacer, the first fixed assembly comprising:
            a first fixed collar having a passage defined therewithin, wherein the passage has an opening that connects to the first opening on the shaft through the hole of the first spacer; and
            a first fixed seal ring connected to the first fixed collar with a leak-tight seal, wherein a side of the first rotatable seal ring is in direct contact with a side of the first fixed seal ring; and
        a housing, wherein the first fixed assembly is fastened to the housing; and
    an axial clamp fastened to the end of the shaft that is opposite the end connected to the chuck, wherein the axial clamp anchors the first rotatable assembly to the shaft, and wherein, when the shaft rotates, the first rotatable assembly rotates with the shaft.

2. The chuck assembly of claim 1, wherein the first fixed seal ring and the second fixed seal ring are made only of metal.

3. The chuck assembly of claim 1, wherein the seal module is made only of metal.

4. The chuck assembly of claim 2, wherein the first spacer is part of the first rotatable assembly.

5. The chuck assembly of claim 4, further comprising:
an o-ring made of metal, wherein the o-ring is in direct contact with the shaft, the first spacer, and the first rotatable collar, and wherein the o-ring has a triangular shape after being compressed into a space formed by the first spacer, and the first rotatable collar, and the first rotatable collar.

6. The chuck assembly of claim 1, further comprising:
a first fixed diaphragm connected to the first fixed collar with a leak-tight seal and to the first fixed seal ring with a leak-tight seal, wherein the first fixed collar is connected to the first fixed seal ring with a leak-tight seal through the first diaphragm.

7. The chuck assembly of claim 1, wherein the first spacer has a first and second channel, wherein the first channel is defined around the first side of the first spacer, wherein the second channel is defined around the second side of the first spacer, wherein the hole connects the first and second channels, and wherein the first channel overlaps the first opening into the first passage of the shaft.

8. The chuck assembly of claim 1 wherein, in response to pressure in the first passage of the shaft, the pressure increases at the direct contact between the first fixed seal ring and the first rotatable seal ring.

9. The chuck assembly of claim 1, further comprising:
a space defined between the first rotatable collar and the first rotatable seal ring, wherein in response to increased pressure in the space, the pressure increases at the direct contact between the first fixed seal ring and the first rotatable seal ring.

10. The chuck assembly of claim 1, wherein:
the shaft further comprises a second passage defined along the axial length of the shaft with one end opening into the wafer chuck and a second opening to the second passage, wherein the second opening is located at a second location along the axial length of the shaft, and wherein the first passage connects to the second passage through a third passage defined with the wafer chuck;
the seal module further comprises:
a second rotatable assembly disposed around the shaft, the second rotatable assembly comprising:
a second spacer having a hole defined therewithin that connects a first side of the second spacer that faces the shaft to a second side of the second spacer that is opposite the first side;
a second rotatable collar having a side in contact with the shaft;
a second rotatable diaphragm connected to the second rotatable collar with a leak-tight seal; and
a second rotatable seal ring connected to the second rotatable diaphragm with leak-tight seal; and
a second fixed assembly disposed around the second spacer and fastened to the housing, the second fixed assembly comprising:
a second fixed collar that connects to the second opening on the shaft through the hole of the fixed second spacer; and
a second fixed seal ring connected to the second fixed collar with a leak-tight seal, wherein a side of the second rotatable seal ring is in direct contact with a side of the second fixed seal ring; and
the axial clamp further anchors the second rotatable assembly to the shaft, wherein, when the shaft rotates, the second rotatable assembly rotates.

11. A chuck assembly comprising:
a shaft connected to a wafer chuck, wherein the shaft has a first passage defined within, and wherein the first passage has a first opening to the wafer chuck; and
a first seal module disposed around the shaft, the first seal module comprising:
a first seal ring configured to rotate with the shaft;
a second seal ring configured to remain stationary when the shaft rotates, wherein the first seal ring is in direct contact with the second seal ring, wherein the first and second seal rings are configured to create a seal where the first and second seal rings are in direct contact;
a first diaphragm connected to the first seal ring, wherein the first diaphragm is configured to rotate with the shaft and to cause the first seal ring to apply a compressive force against the second seal ring to maintain the seal between the first seal ring and the second seal ring as the shaft rotates;
an inlet port; and
a first collar sealed to the second seal ring with a leak-tight seal, wherein the first collar is configured to connect the inlet port of the first seal module to the first passage defined within the shaft.

12. The chuck assembly of claim 11 further comprising:
a second seal module disposed around the shaft and adjacent the first seal module, the second seal module comprising:
a third seal ring configured to rotate with the shaft;
a fourth seal ring configured to remain stationary when the shaft rotates, wherein the third seal ring is in direct contact with the fourth seal ring, wherein the third and fourth seal rings are configured to create a seal where the third and fourth seal rings are in direct contact;
an outlet port; and
a second collar sealed to the fourth seal ring with a leak-tight seal, wherein the second collar is configured to connect the outlet port of the second seal module to a second passage defined within the shaft.

13. The chuck assembly of claim 12, wherein the first passage and the second passage are connected through a third passage defined within the wafer chuck.

14. The chuck assembly of claim 11, wherein the first seal module, the shaft, and the wafer chuck are made only of metal.

15. The chuck assembly of claim 11, wherein the first passage has a second opening along the axial length of the shaft, and wherein the inlet port connects to the first passage through the second opening.

16. The chuck assembly of claim 11, wherein the first passage is defined by a hole in the shaft along the axial length of the shaft.

17. The chuck assembly of claim 11, wherein the shaft has a third passage defined within, and wherein the third passage has an opening to the wafer chuck.

18. The chuck assembly of claim 11, wherein the first seal ring and the second seal ring comprise of metal.

19. The chuck assembly of claim 11, wherein the first seal ring and the second seal ring comprise of metal ceramic.

* * * * *